(12) United States Patent
Leuschner et al.

(10) Patent No.: US 8,310,866 B2
(45) Date of Patent: Nov. 13, 2012

(54) MRAM DEVICE STRUCTURE EMPLOYING THERMALLY-ASSISTED WRITE OPERATIONS AND THERMALLY-UNASSISTED SELF-REFERENCING OPERATIONS

(75) Inventors: Rainer Leuschner, Regensburg (DE); Ulrich Klostermann, Munich (DE); Richard Ferrant, Esquibien (FR)

(73) Assignees: Qimonda AG, Munich (DE); ALTIS Semiconductor, SNC, Corbeil Essonnes (FR)

( * ) Notice: Subject to any disclaimer, the term of this patent is extended or adjusted under 35 U.S.C. 154(b) by 1085 days.

(21) Appl. No.: 12/168,671

(22) Filed: Jul. 7, 2008

(65) Prior Publication Data

US 2010/0002501 A1 Jan. 7, 2010

(51) Int. Cl.
G11C 11/02 (2006.01)
G11C 7/00 (2006.01)
H01L 21/00 (2006.01)

(52) U.S. Cl. .................. 365/171; 365/158; 365/189.011
(58) Field of Classification Search .................. 365/171, 365/158, 189.011; 438/3
See application file for complete search history.

(56) References Cited

U.S. PATENT DOCUMENTS

| 5,686,838 | A | 11/1997 | van den Berg |
| 6,771,534 | B2 | 8/2004 | Stipe |
| 6,777,730 | B2 | 8/2004 | Daughton et al. |
| 7,309,617 | B2 | 12/2007 | Ruehrig et al. |
| 2002/0030489 | A1 | 3/2002 | Lenssen et al. |
| 2005/0052902 | A1 | 3/2005 | Smith et al. |
| 2005/0105355 | A1 | 5/2005 | Brueckl et al. |
| 2005/0208680 | A1* | 9/2005 | Ruehrig et al. ............. 438/3 |

FOREIGN PATENT DOCUMENTS

WO WO 03/083873 A1 10/2003

OTHER PUBLICATIONS

Daughton, J.M., "Advanced MRAM Concepts," Feb. 7, 2001, pp. 1-6, NVE Corporation, Eden Prairie, MN.
Das, J., et al., "Degradation and time dependent breakdown of stressed ferromagnetic tunnel junctions," Journal of Applied Physics, vol. 89, No. 11, Jun. 1, 2001, pp. 7350-7352, American Institute of Physics.
Beech, R., et al., "Low Power 256k MRAM Design," NVMTS 2002, Nov. 6, 2002, pp. 1-16, NVE Corporation, Eden Prairie, MN.
Durlam, M., et al., "A 0.18 μm 4Mb Toggling MRAM," 2005 IEDM Technical Digest, Session 34, paper #6, 3 pages, IEEE.

* cited by examiner

Primary Examiner — Alexander Sofocleous
Assistant Examiner — Hai Pham

(57) ABSTRACT

A thermally-assisted MRAM structure which is programmable at a writing mode operating temperature is presented and includes an anti-ferromagnet, an artificial anti-ferromagnet, a barrier layer, and a free magnetic layer. The anti-ferromagnet is composed of a material having a blocking temperature $T_b$ which is lower than the writing mode operating temperature of the magnetic random access memory structure. The artificial anti-ferromagnet is magnetically coupled to the anti-ferromagnet, and includes first and second magnetic layers, and a coupling layer interposed therebetween, the first and second magnetic layers having different Curie point temperatures. The barrier layer is positioned to be between the second magnetic layer and the free magnetic layer.

16 Claims, 2 Drawing Sheets

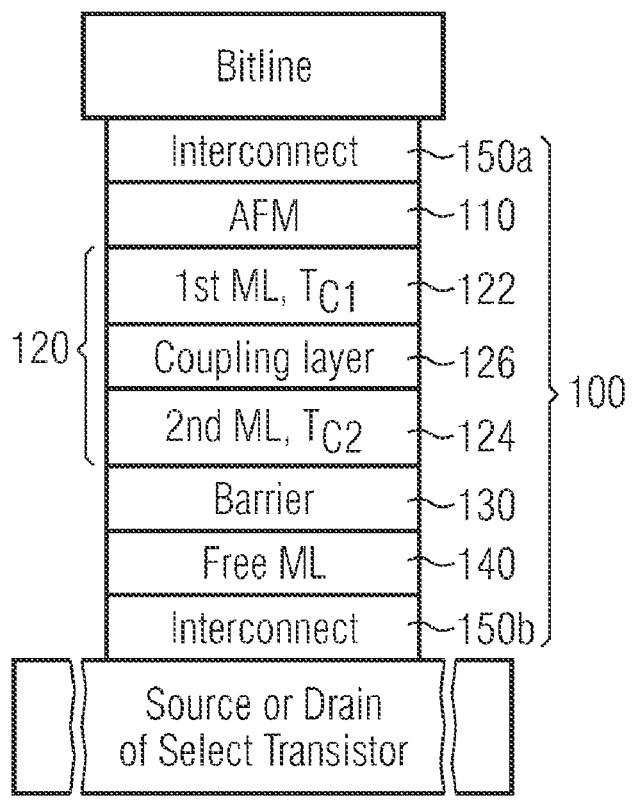
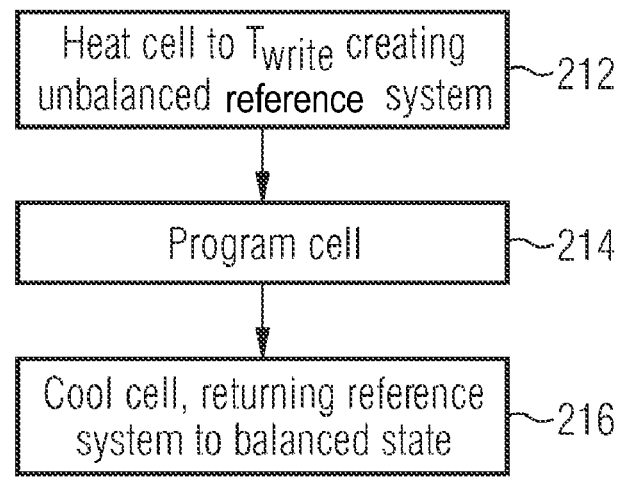

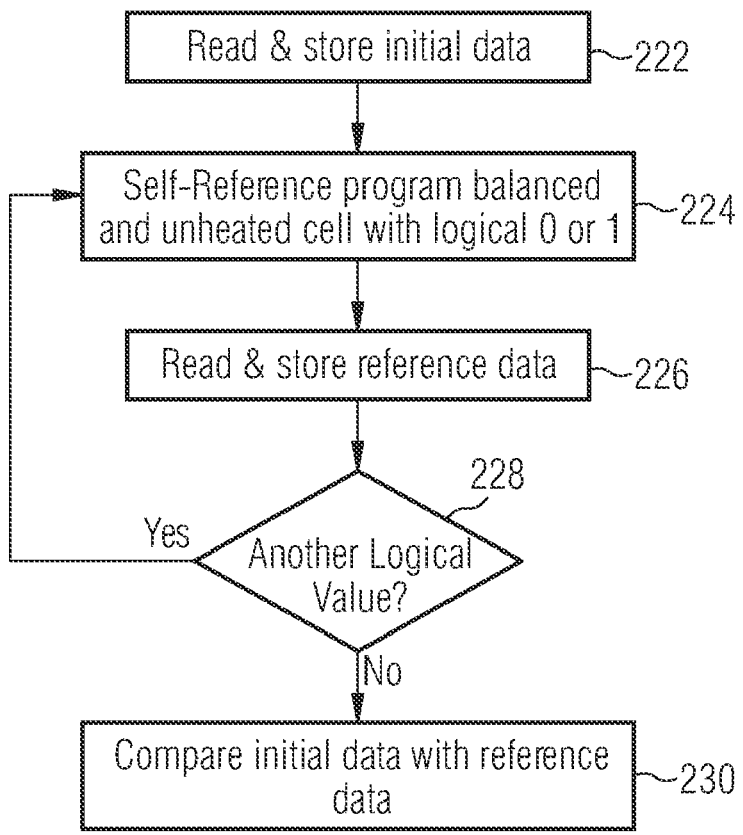
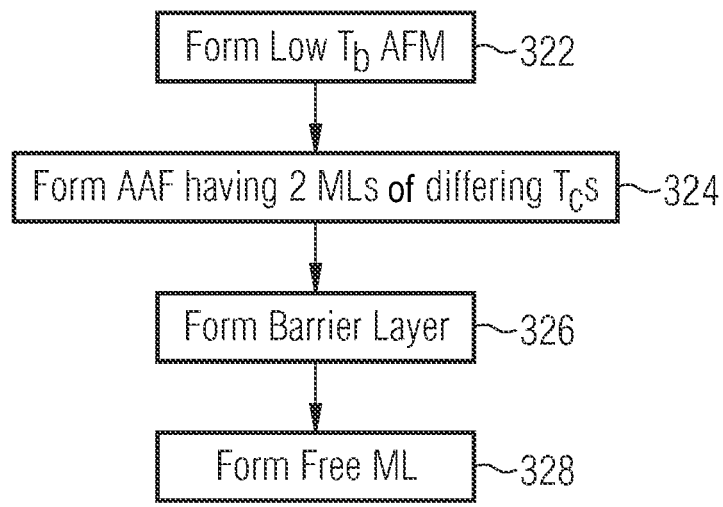

MRAM DEVICE STRUCTURE EMPLOYING THERMALLY-ASSISTED WRITE OPERATIONS AND THERMALLY-UNASSISTED SELF-REFERENCING OPERATIONS

TECHNICAL FIELD

The present invention relates to magnetic random access memory (MRAM) cells, and more particularly to thermally-assisted MRAM cells employing thermally-unassisted self-referencing operations, methods of operation, and manufacture.

BACKGROUND

Magnetic random access memory (MRAM) devices are emerging as possible replacements for conventional RAM memory structures such as dynamic and static RAM structures. MRAM devices exhibit fast access speeds and greater immunity to radiation compared to conventional DRAM and SRAM structures, and do not require applied power to retain their logical state.

Thermally-assisted writing represents a conventional MRAM programming technique in which a heating current is supplied across the MRAM's barrier layer, the resistance of which causes the storage layer to heat to a predefined temperature. The free magnetic layer or the MRAM cell is preferably constructed from a material which exhibits a decreasing magnetic coercivity with increasing temperature, such that when the storage layer is sufficiently heated, lower magnitude writing currents can be used to re-orient the existing magnetic polarization of the storage layer.

Self-referencing is a technique also used in optimizing the performance of an MRAM device, and particularly, reading accuracy. In this technique, an MRAM cell undergoes operations in which the cell resistance is compared to resistances of the same or a similar cell when in a logical 1 and/or a logical 0 state. In a typical operation, the resistance corresponding to an initial state of the MRAM is stored, and subsequently a logical 1 is written to the cell and the resulting resistance stored. Similarly, a logical 0 may be written to the cell, and the result stored. The resistance corresponding to the MRAM's original state is subsequently compared against the resistance corresponding to the logical 1 or 0 self-reference measurements, and the logical state corresponding to the resistance having the closest correlation thereto is deemed to be the logical state of the MRAM cell.

As self-referencing operations include a programming phase in which logical 0 and/or 1 states are written to the MRAM cell, the aforementioned thermal-assist process is conventionally used to write the 0 and 1 logical states during this process. Thermally-assisted self-referencing presents difficulties, as it requires heating the MRAM cell to write either a 0 or 1 to the MRAM cell, waiting a predefined period to allow the cell to cool, and reading the cell. The process can be shortened if the MRAM cell is formed (e.g., with a heat sink) such that the cooling process occurs faster. In such an arrangement, however, the aforementioned thermally-assisted writing process is negatively impacted, as heating during the programming process will occur more slowly and require more energy in order to heat the MRAM cell to the required temperature.

SUMMARY OF THE INVENTION

In a representative embodiment of the invention, a thermally-assisted MRAM structure which is programmable at a writing mode operating temperature is presented and includes an anti-ferromagnet, an artificial anti-ferromagnet, a barrier layer, and a free magnetic layer. The anti-ferromagnet includes a material having a blocking temperature $T_b$ which is lower than the writing mode operating temperature of the magnetic random access memory structure. The artificial anti-ferromagnet is magnetically coupled to the anti-ferromagnet, and includes first and second magnetic layers, and a coupling layer interposed therebetween, the first and second magnetic layers having different Curie point temperatures. The barrier layer is positioned to be adjacent to the second magnetic layer, and the free magnetic layer is positioned to be adjacent to the barrier layer.

These and other features of the invention will be better understood in view of the following drawings and detailed description.

BRIEF DESCRIPTION OF THE DRAWINGS

FIG. 1 illustrates an MRAM device structure in accordance with an embodiment of the present invention;

FIG. 2A illustrates a method for performing a thermally-assisted writing operation in the MRAM device of FIG. 1 in accordance with an embodiment of the present invention;

FIG. 2B illustrates a method for performing a thermally-unassisted self-referencing operation in the MRAM device of FIG. 1 in accordance with an embodiment of the present invention; and FIG. 3 illustrates a method for constructing an MRAM device structure in accordance with an embodiment of the present invention.

For clarity, previously identified features retain their reference indicia in subsequent drawings.

DETAILED DESCRIPTION OF ILLUSTRATIVE EMBODIMENTS

Various embodiments of the present invention provide a thermally-assisted MRAM structure that enables device self-reference without thermal heating. Thermal-assisted writing permits lower writing current, and accordingly, implementation of smaller current handling transistors and higher density MRAM memory devices and arrays. A greater degree of thermal insulation can be provided to the MRAM structure, since thermal heating is not required during self-referencing. Greater MRAM thermal insulation may permit the MRAM device to heat more quickly and efficiently during thermally-assisted write operations, thereby increasing programming speed and reducing power consumption.

Exemplary MRAM Device Structure

FIG. 1 illustrates an exemplary embodiment of a MRAM device structure in accordance with the present invention. As shown, the MRAM structure 100 includes an anti-ferromagnet 110 (AFM), an artificial anti-ferromagnet 120 (AAF) magnetically coupled to the anti-ferromagnet 110, a barrier layer 130 adjacent to the artificial anti-ferromagnet; and a free magnetic layer 140 adjacent to the barrier layer 130. It will be understood that the order of layers of the MRAM structure 100 may be reversed in some embodiments. The MRAM structure 100 is preferably formed as a part of a monolithic integrated circuit process, for example, as further described below. As used herein, the term "magnetically coupled" refers to the orientation of particular components in a manner such that a magnetic field can be coupled (e.g., ferromagnetically, anti-ferromagnetically) between the described components. Such an orientation includes components/layers which directly contact each other, as well as those components/ layers which are spaced apart, perhaps by intervening structures, but which still are operable to provide magnetic coupling therebetween.

In a particular embodiment, the AFM 110 is formed from a material having a blocking temperature ($T_b$) which is lower than the intended writing mode operating temperature ($T_{write}$) of the magnetic random access memory structure 100. As known in the art, a material's blocking temperature is the temperature above which the material exhibits a sufficiently low magnetic coercivity so that the material's magnetic polarization is readily re-oriented in the presence of a magnetizing field. The description "writing mode operating temperature" ($T_{write}$) refers to the intended temperature at which the MRAM structure 100 operates during a thermally-assisted write operation. In a particular embodiment, $T_{write}$ ranges from 150-300° C., for example, 250° C. Further particularly, exemplary AFM materials exhibiting a blocking temperature below these temperatures include anti-ferromagnetic materials such as manganese alloys (e.g., iridium manganese (IrMn), iron manganese (FeMn), rhodium manganese (RhMn), platinum manganese (PtMn), platinum palladium manganese (PtPdMn), nickel manganese (NiMn), $Ni_xFe_yIr_zMn$, and the like. Those skilled in the art will appreciate that other programming mode operating temperatures and AFM materials may be used in alternative embodiments of the present invention.

Magnetically coupled to the AFM 110, the artificial anti-ferromagnet (AAF) 120 includes a first magnetic layer 122, a second magnetic layer 124, and a coupling layer 126 interposed therebetween. The AAF may include or be composed of a Co/non-magnetic metal/Co system, or other suitable materials. For example, the first and second magnetic layers 122 and 124 may include materials such as nickel (Ni), iron (Fe), or cobalt (Co), or combinations thereof (e.g., nickel iron (NiFe), cobalt iron (CoFe) and nickel iron cobalt (NiFeCo), and the coupling layer 126 may be formed from ruthenium (Ru), osmium (Os), rhenium (Re), chromium (Cr), rhodium (Rh), or copper (Cu), or combinations thereof. Those skilled in the art will appreciate that other materials may be used in alternative embodiment of the present invention.

In some embodiments, the first and second magnetic layers 122 and 124 may include materials having different Curie point temperatures ($T_C$). In some embodiments, the Curie point temperature of either the first or second magnetic layers 122 or 124 may be below the intended write mode operating temperature of the structure 100, the other magnetic layer 122 or 124 having a Curie point temperature above the programming mode operating temperature. As an example, the first magnetic layer 122 may include NiFe, or CoFeB, and exhibit a $T_C$ above $T_{write}$, and the second magnetic layer 124 may include Co alloys, such as CoFeSiMoB, CoV, CoCr, and exhibit a $T_C$ (e.g., 200-230° C.) below $T_{write}$. In another example, the first magnetic layer 122 may include a material having a $T_C$ below $T_{write}$, and the second magnetic layer 124 may include a material having a $T_C$ above $T_{write}$. In some embodiments of this later instance in which the Curie point temperature of the first magnetic layer 122 is below the writing mode operating temperature (i.e., $T_{write} > T_C \geq T_b$), the blocking temperature of the AFM 110 is lower than or equal to the Curie point temperature of the first magnetic layer 122. This arrangement ensures that the AFM 110 does not pin the first magnetic layer 122 during the write mode.

Completing the MRAM structure 100, the barrier layer 130 is adjacent to the second magnetic layer 124, and a free magnetic layer 140 is adjacent to the barrier layer 130, to form a tunneling magnetoresistive (TMR) element. The barrier layer 130 provides the magnetic tunneling junction, the electrical resistance across which determines the logical state of the structure 100. The electrical resistance may be determined by the relative orientations of the magnetic fields between the second magnetic layer 124 and the free magnetic layer 140. Embodiments of the barrier layer 130 include silicon dioxide ($SiO_2$), aluminum oxide ($Al_2O_3$), magnesium oxide (MgO), hafnium oxide ($HfO_2$), boron oxide ($B_2O_3$), tantalum oxide ($Ta_2O_5$), zinc oxide ($ZnO_2$) and other oxides, nitrides, or other suitable dielectrics, and the like. Exemplary embodiments of the free magnetic layer 140 may include nickel (Ni), iron (Fe), or cobalt (Co), or combinations thereof. In other embodiments, the free magnetic layer 140 may include Co alloys, such as CoFeSiMoB, CoV, CoCr which exhibit a $T_C$ below $T_{write}$. Depending upon the construction of the MRAM structure 100, interconnects 150a and 150b may be used to provide contact to the bit line structures, and, via a selection transistor or other selection device (not shown), to the word line structures (not shown). In some embodiments, interconnects 150a and 150b may be composed of a TaN material, although other materials may be used in accordance with various embodiments of the present invention. Furthermore, the MRAM structure 100 may be implemented in an array to provide a memory device of any particular size, for example, 1 GB or more of storage capacity. In such an application, interface contacts 150a and 150b may be connected (directly or indirectly, such as through a selection transistor) to bit and word lines which interconnect a multiplicity of MRAM structures 100 therealong.

Exemplary Methods for Thermally-Assisted Writing and Thermally-Unassisted Self-Referencing FIGS. 2A and 2B illustrate exemplary methods for performing thermally-assisted writing and thermally-unassisted self-referencing operations, respectively, in an MRAM device in accordance with an embodiment of the present invention. Each of the methods may occur at different times; for example, cell writing operations described in FIG. 2A may occur before or after cell self-referencing operations described in FIG. 2B, or visa versa.

Referring to FIG. 2A, a cell writing operation is initiated at 212 by supplying a heating current (in the form of a pulse of a predefined duration in one embodiment of the invention) to the MRAM device structure 100, the heating current operable to heat the structure 100 to the desired writing mode operating temperature $T_{write}$. Once the structure 100 has been heated to the predefined temperature $T_{write}$, the magnetic moments of the free magnetic layer 140 and one of the first or second magnetic layers having a low $T_C$ (e.g., the second layer 124) may be substantially reduced or eliminated, as $T_{write} >$ low $T_C$. In addition, the AFM 110 will lose its pinning ability, permitting the first magnetic layer 122 to be switched by an applied magnetic field. Accordingly, the AAF 120 may become unbalanced at the elevated writing mode operating temperature. Further, because the free magnetic layer 140 and the first magnetic layer 122 have a $T_C$ below $T_{write}$, they do not generate a magnetic field, which would interfere with and require a stronger applied magnetic field.

At 214, a magnetic field is applied to the MRAM structure 100 (e.g., by supplying current in a particular direction to or proximate to the MRAM structure 100), the applied magnetic field operable to re-orient the magnetic polarization of the first (i.e., higher $T_C$) magnetic layer 122.

At 216, the MRAM structure 100 is cooled below $T_{write}$, and the orientation of the first magnetic layer 122 determines the orientation of the AFM 110 (in parallel therewith), and the second magnetic layer 124 (in anti-parallel therewith). In this manner, the AAF 120 returns to a balanced state.

In some embodiments, heating and writing currents are applied at different times, the timing of each of which is controlled to allow sufficient heating of the MRAM structure prior to application of the programming magnetic field. Such timing, of course, will depend upon the particular construction of the MRAM structure 100, but in an exemplary embodiment the writing/field pulse is delayed approximately 0 to 5 ns behind the heating pulse.

FIG. 2B illustrates an exemplary method for performing a thermally-unassisted self-referencing operation in the MRAM device of FIG. 1 in accordance with an embodiment of the present invention. At 222, a self-referencing operation is initiated, whereby the MRAM structure's initial data (e.g., cell resistivity) is read and stored. Cell reading may occur, for example, by supplying a current to the word or bit line, and measuring the resultant voltage thereacross to determine the cell's resistivity, or alternatively, applying a predefined voltage across the structure and measuring the current supplied therethrough.

Next at 224, the selected structure/cell is programmed without additional thermal heating, the selected structure operating at a self-referencing mode operating temperature $T_{SR}$ which is below the writing mode operating temperature $T_{write}$. The term "self-referencing mode operating temperature" refers to an operating temperature of the selected MRAM structure 100 when not supplied a heating current or signal, as is done during the writing mode. The self-referencing temperature $T_{SR}$ may be the ambient operating temperature of the MRAM device, which may range, for example, from 0° to 100° C., and in some embodiments may be between 10° and 50° C.

In some embodiments, at 224, the selected cell is programmed with a logical 0 or 1 by exposing the free magnetic layer 140 to a magnetic field of a particular orientation. The free magnetic layer 140 can be switched at an unheated temperature by the supplied magnetic field, as the first and second magnetic layers 122 and 124 are balanced at the self-reference mode operating temperature, as this temperature is lower than the writing temperature. Because the AAF 120 is balanced at the self-referencing operating temperature $T_{SR}$, the magnetic polarization of the free magnetic layer 140 may be easily re-oriented by the applied magnetic field without heating the MRAM structure 100.

At 226, the content (i.e., the resistivity) of the structure is read and stored as a first reference value. At 228, a determination is made as to whether a second reference value has been programmed into the cell, and if so, the process returns to 224 where the MRAM structure/cell is programmed (without applied heating) with a second logical value in the same manner as described above, that content being subsequently read and stored as a second reference in a second iteration of 224. At 230, the original content of the memory structure is compared with each of the first and second reference values, the value of the original content being assigned the logical value corresponding to the reference value which most closely correlates therewith. In this manner, the structure 100 can undergo the conventional self-referencing operations: write 1 (no heat)/read, write 0 (no heat)/read to accurately determine the existing state of the selected MRAM cell without the heating the cell.

Exemplary Method of Manufacture

FIG. 3 illustrates an exemplary method for constructing the MRAM device structure of FIG. 1 in accordance with an embodiment of the present invention. No particular order is indicated in the following process operations, as any of the following processes may occur before, after, or concurrently with other of the described operations in accordance with known fabrication processes. For example, the operations may generally be performed in an order that is the reverse of the order shown in the figure or described below, or in any other suitable order. The following operations may be employed as a part of a semiconductor fabrication process in which a plurality of device structures is monolithically formed on an integrated substrate.

Referring to FIG. 3, at 322 an anti-ferromagnet (AFM) 110 is formed having a blocking temperature $T_b$ which is below the writing mode operating temperature of the MRAM structure. In some embodiments, the anti-ferromagnet includes IrMn, which is deposited at a thickness of 20 to 80 Å. Depending upon construction of the MRAM structure, the AFM 110 may be deposited on interconnect 150b, which may include, e.g., TaN deposited at 5-100 nm in thickness, and which provides interconnectivity between the MRAM structure 100 and a select transistor or other selection structure connected directly or indirectly to bit and/or word line structures.

At 324, an artificial anti-ferromagnet (AAF) 120 is formed so as to be magnetically coupled to the AFM 110, the AAF 120 formed so as to include two magnetic layers having different Curie point temperatures. In some embodiments of this process, one of the magnetic layers is formed from a material having a Curie point temperature below the writing mode operation temperature of the MRAM structure 100, and a second of the magnetic layers is constructed from a material having a Curie point temperature higher than the writing mode operating temperature. In such an embodiment, the first magnetic layer 122 may include materials such as CoFe, CoFeB, NiFeCo, or multiple sub-layers of such materials, such as CoFe/CoFeB sub-layers. Such materials or sets of sub-layers have a $T_C$ above typical thermally-assisted temperatures of 250° C., and are deposited at a thickness of approximately 1-5 nm. The second of the magnetic layers 124 may be composed of Co alloys, such as CoFeSiMoB, CoV, CoCr, or multiple sub-layers. These materials and/or sub-layers have a $T_C$ below 250° C. and are deposited at a thickness of approximately 1-5 nm. The coupling layer 126, in one embodiment, includes or is composed of 0.5-1.5 nm thick Ru. Other materials and deposition dimensions will be apparent to those skilled in the art.

In another embodiment of 324, the first magnetic layer 122 includes or is composed of a low $T_C$ (i.e., $<T_{write}$) material, and the second magnetic layer 124 includes or is composed of a high $T_C$ (i.e., $>T_{write}$) material. In such an embodiment, the first magnetic layer 122 has a $T_C$ greater or equal to the blocking temperature $T_b$ of the AFM 110, and lower than the writing mode operating temperature, i.e., $T_{write} > T_C \geq T_b$. In this embodiment, the first magnetic layer 122 includes or is composed of the aforementioned low $T_C$ Co alloys deposited at a thickness of 1-20 nm, and the second magnetic layer 124 includes or is composed of the aforementioned high $T_C$ materials, such as CoFe, CoFeB, NiFeCo, or other suitable materials, deposited at a thickness of 0.5-1.5 nm.

At 326, a barrier layer 130 is formed adjacent to the AAF 120, the barrier layer 130 being formed from materials such silicon dioxide ($SiO_2$) aluminum oxide ($Al_2O_3$), magnesium oxide (MgO), haffiium oxide ($HfO_2$), boron oxide ($B_2O_3$), tantalum oxide ($Ta_2O_5$), zinc oxide ($ZnO_2$) and other oxides, nitrides, and the like. In some embodiments, the barrier layer 130 is formed from MgO at a thickness of 0.5-2 nm.

At 328, a free magnetic layer 140 is formed adjacent to the barrier layer 130. In some embodiments, the free magnetic layer 140 includes a low Curie temperature material, such as the aforementioned Co alloys of the second magnetic layer 124, and is deposited at a thickness of 1-20 nm. In other embodiments of the invention in which the free magnetic layer includes or is composed of a high $T_C$ material (i.e., $T_C > T_{write}$), it may be composed of CoFe, CoFeB, CoFeNi, or other suitable materials, and is deposited at a thickness of 1-5 nm.

Although not shown, the process may further include the deposition of the interconnect material (e.g., TaN) 150a and 150b to facilitate interconnection to the MRAM structure. Exemplary thicknesses of the interconnecting material would be in the range of 5-100 nm.

The described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer or other such programmable device to carry out the intended functions.

The foregoing description has been presented for purposes of illustration and description. It is not intended to be exhaustive or to limit the invention to the precise form disclosed, and many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A thermally-assisted magnetic random access memory structure which is programmable at a writing mode operating temperature, comprising:
   an anti-ferromagnet having a blocking temperature $T_b$, said blocking temperature $T_b$ being lower than the writing mode operating temperature;
   an artificial anti-ferromagnet magnetically coupled to the anti-ferromagnet, the artificial anti-ferromagnet comprising:
      a first magnetic layer magnetically coupled to the anti-ferromagnet,
      a second magnetic layer; and
      a coupling layer interposed between the first and second magnetic layers,
   wherein the first and second magnetic layers have different Curie point temperatures;
   a free magnetic layer; and
   a barrier layer interposed between the second magnetic layer and the free magnetic layer.

2. The magnetic random access memory structure of claim 1, wherein:
   the Curie point temperature of the first magnetic layer is higher than the writing mode operating temperature, and
   the Curie point temperature of the second magnetic layer is lower than the writing mode operating temperature.

3. The magnetic random access memory structure of claim 1, wherein:
   the Curie point temperature of the first magnetic layer is lower than the writing mode operating temperature, and
   the Curie point temperature of the second magnetic layer is higher than the writing mode operating temperature.

4. The magnetic random access memory structure of claim 1, wherein the magnetic moments of the artificial anti-ferromagnet are magnetically unbalanced at the writing mode operating temperature.

5. The magnetic random access memory structure of claim 1, wherein the magnetic moments of the artificial anti-ferromagnet are magnetically balanced at a temperature below the writing mode operating temperature.

6. The magnetic random access memory structure of claim 1, wherein the magnetic random access memory structure is an element in a memory array.

7. A thermally-assisted magnetic random access memory structure which is programmable at a writing mode operating temperature, comprising:
   an anti-ferromagnet having a blocking temperature $T_b$, said blocking temperature $T_b$ being lower than the writing mode operating temperature;
   an artificial anti-ferromagnet magnetically coupled to the anti-ferromagnet, the artificial anti-ferromagnet comprising:
      a first magnetic layer magnetically coupled to the anti-ferromagnet,
      a second magnetic layer; and
      a coupling layer interposed between the first and second magnetic layers;
      wherein the Curie point temperature of either the first magnetic layer or the second magnetic layer is higher than the writing mode operating temperature;
   a free magnetic layer; and
   a barrier layer interposed between the second magnetic layer and the free magnetic layer.

8. The magnetic random access memory structure of claim 7, wherein:
   the Curie point temperature of the first magnetic layer is lower than the writing mode operating temperature, and
   the Curie point temperature of the second magnetic layer is higher than the writing mode operating temperature.

9. The magnetic random access memory structure of claim 7, wherein the Curie point temperature of the free magnetic layer is lower than the writing mode operating temperature.

10. The magnetic random access memory structure of claim 7, wherein the magnetic moments of the artificial anti-ferromagnet are substantially magnetically unbalanced at the writing mode operating temperature.

11. The magnetic random access memory structure of claim 7, wherein the magnetic moments of the artificial anti-ferromagnet are magnetically balanced at a temperature below the writing mode operating temperature.

12. The magnetic random access memory structure of claim 7, wherein the magnetic random access memory structure is an element in a memory array.

13. A method for manufacturing a thermally-assisted magnetic random access memory structure programmable at a writing made operating temperature, the method comprising:
   forming an anti-ferromagnet having a blocking temperature $T_b$, said blocking temperature $T_b$ being lower than the writing mode operating temperature;
   forming an artificial anti-ferromagnet which is magnetically coupled to the anti-ferromagnet, the artificial anti-ferromagnet comprising:
      a first magnetic layer magnetically coupled to the anti-ferromagnet,
      a second magnetic layer; and
      a coupling layer interposed between the first and second magnetic layers,
   wherein the first and second magnetic layers have different Curie point temperatures;
   forming a free magnetic layer; and
   forming a barrier layer interposed between the second magnetic layer and the free magnetic layer.

14. The method of claim 13, wherein forming an artificial anti-ferromagnet comprises:

forming the first magnetic layer such that the Curie point temperature thereof is higher than the writing mode operating temperature, and forming second magnetic layer such that the Curie point temperature thereof is lower than the writing mode operating temperature.

15. The method of claim 13, wherein forming an artificial anti-ferromagnet comprises:

forming the first magnetic layer such that the Curie point temperature thereof is lower than the writing mode operating temperature, and forming second magnetic layer such that the Curie point temperature thereof is higher than the writing mode operating temperature.

16. The method of claim 13, further comprising coupling the free magnetic layer to the barrier layer, wherein said free magnetic layer comprises a Curie point temperature lower than the writing mode operating temperature.

* * * * *